United States Patent [19]
Saeki

[11] Patent Number: 5,535,153
[45] Date of Patent: Jul. 9, 1996

[54] SEMICONDUCTOR DEVICE

[75] Inventor: Takanori Saeki, Tokyo, Japan

[73] Assignee: NEC Corporation, Tokyo, Japan

[21] Appl. No.: 322,347

[22] Filed: Oct. 13, 1994

[30]  Foreign Application Priority Data

Nov. 1, 1993  [JP]  Japan ..................................... 5-273682

[51] Int. Cl.$^6$ ..................................................... G11C 5/06
[52] U.S. Cl. .................................. 365/72; 365/51; 365/63; 365/149; 257/296
[58] Field of Search ............................... 365/72, 63, 149, 365/51; 257/296, 377, 381

[56]  References Cited

U.S. PATENT DOCUMENTS 5,361,233  11/1994  Kotani ..................................... 365/207

FOREIGN PATENT DOCUMENTS 55-41622  10/1981  Japan .

OTHER PUBLICATIONS

T. Sugibayashi et al., "WP 3.5: A 30ns 256Mb DRAM with Multi–Divided Array Structure," *IEEE International Solid-State Circuits Conference*, Feb. 24, 1993, pp. 50–51.

K. Noda et al., "A Boosted Dual Word–line Decoding Scheme for 256Mb DRAMs," 1992 Symposium on VLSI Circuits Digest of Technical Papers, pp. 112–113.

*Primary Examiner*—David C. Nelms
*Assistant Examiner*—Huan Hoang
*Attorney, Agent, or Firm*—Burns, Doane, Swecker & Mathis

[57]  ABSTRACT

A semiconductor device has a plurality of cell arrays each comprising a plurality of memory cells each composed of an MIS transistor and a capacitor formed from a conductive layer, a plurality of word lines and bit lines intersecting each other at the memory cells, a plurality of sense amplifiers alternating with the cell arrays, a plurality of row decoders, a plurality of column decoders, each of the column decoders being connected to and shared by a plurality of the sense amplifiers, and a plurality of interconnections for transmitting selective signals from the word lines, the bit lines and the column decoders. The interconnections for transmitting selective signals from the bit lines and the column decoders extend in the direction in which the cell arrays and the sense amplifiers are arrayed. The interconnections for transmitting selective signals from the word lines, the bit lines and the column decoders are formed from three different layers, other than the conductive layer for forming a capacitor, on the cell arrays. The interconnections for transmitting selective signals from the column decoders are formed from a metallic layer on the cell arrays.

3 Claims, 11 Drawing Sheets

— METAL WIRING LAYER
— WIRING LAYER EXCEPT METAL WIRING LAYER

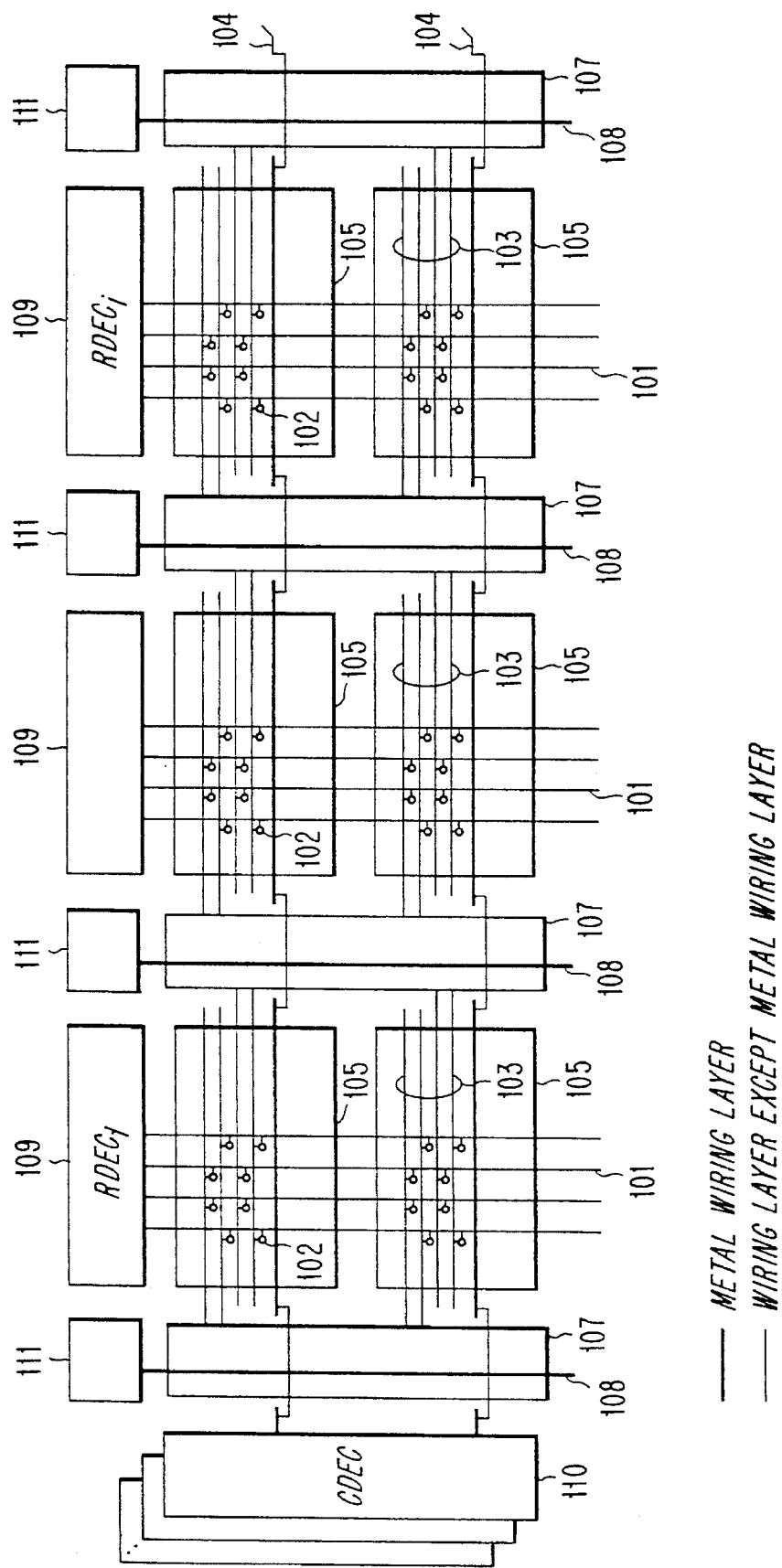

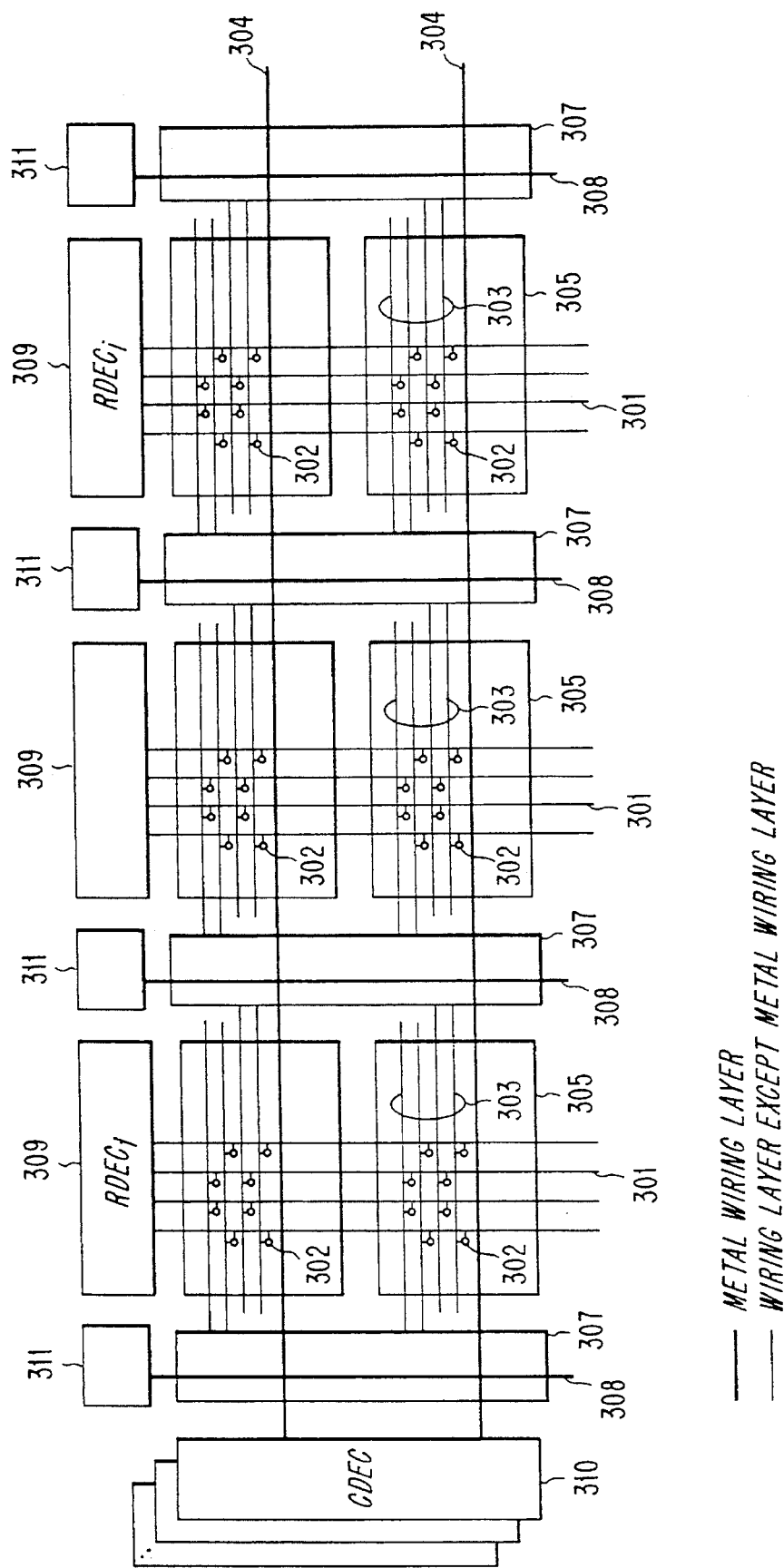

SEMICONDUCTOR DEVICE

BACKGROUND OF THE INVENTION

The present invention relates to a semiconductor device, and more particularly to a dynamic memory semiconductor device including shared sense amplifiers. One known dynamic memory semiconductor device disclosed in Japanese patent application No. 55-41622 has a plurality of sense amplifiers sharing a column decoder circuit which produces a selective signal for controlling switches between the sense amplifiers and data output lines. The area of the dynamic memory semiconductor device is prevented from being increased when implemented in a large-scale configuration because the number of column decoders can be reduced. FIGS. 1 through 5 of the accompanying drawings show the layouts of some conventional semiconductor devices with shared sense amplifiers. The conventional semiconductor devices are classified into several types according to the resistance of the material used of interconnections and the scale of the semiconductor device.

FIG. 1 shows the layout of a first conventional semiconductor device. The conventional semiconductor device shown in FIG. 1 has interconnections made up of three layers, i.e., a polycrystalline silicon layer, a silicide layer, and a metallic layer. More specifically, word lines 401 are formed from the polycrystalline silicon layer and shared by the gate electrodes of MIS (Metal Insulator Semiconductor) transistors of memory cells 402. Bit lines 403 and interconnections (hereinafter referred to as "Y switches") 404 for transmitting selective signals from column decoders are formed from the silicide layer. One Y switch 404 is provided with respect to every four or eight bit lines 403. The metallic layer provides word-backing interconnections 406 disposed on cell arrays 405 for the purpose of virtually reducing the resistance of the word lines 401, array signal lines 408 disposed on sense amplifiers 407 parallel to the word lines 401 for transmitting sense amplifier drive signals or the like, and interconnections in row decoders 409, column decoders 410, array signal drive circuits 411, and peripheral circuits.

FIG. 2 shows the layout of a second conventional semiconductor device. The conventional semiconductor device shown in FIG. 2 has interconnections made up of three layers, i.e., a polycrystalline silicon layer and two metallic layers. Stated otherwise, the semiconductor device shown in FIG. 2 is equivalent to the semiconductor device shown in FIG. 1 where the silicide layer is replaced with a metallic layer. The resistance of Y switches 504 is reduced because they are composed of the metallic layer. Since more sense amplifiers can be connected than in the first conventional semiconductor device, the semiconductor device shown in FIG. 2 is more suitable for large-scale integration.

FIG. 3 shows the layout of a third conventional semiconductor device. The conventional semiconductor device shown in FIG. 3 has interconnections made up of three layers, i.e., a laminated layer of polycrystalline silicon and silicide (hereinafter referred to as a "polycide layer"), a silicide layer, and a metallic layer. More specifically, word lines 601 are formed from the polycide layer and shared by the gate electrodes of MIS transistors of memory cells 602. Y switches 604 are formed from the silicide layer. Bit lines 603, array signal lines 608 disposed on sense amplifiers 607, interconnections in row decoders 609, column decoders 610, array signal drive circuits 611, and peripheral circuits are formed from the metallic layer. Inasmuch as the bit lines and the Y switches are formed from different layers, unlike the first and second conventional semiconductor devices, if the bit lines are fabricated by the same process, they can be narrowed in the absence of any Y switches in their layer, resulting in a reduction in the size of the memory cell arrays. Furthermore, since the Y switches 604 are arranged at wide intervals, their width may be greater than in the first conventional semiconductor device, and their resistance may be reduced for a larger storage capacity.

However, the third conventional semiconductor device is less suitable for a larger storage capacity than the second conventional semiconductor device because the Y switches 604 have a greater resistance than those of the metallic layer in the second conventional semiconductor device. In the third conventional semiconductor device, no word-backing interconnections are employed, but the word lines are constructed from the polycide layer for reducing the resistance of the word lines. Consequently, the resistance of the word lines is not lowered as much as for the word lines combined with the word-backing interconnections, and hence the number of cells that can be connected to the word lines cannot be increased.

FIG. 4 shows the layout of a fourth conventional semiconductor device. The conventional semiconductor device shown in FIG. 4 has interconnections made up of four layers, i.e., a polycrystalline silicon layer, a silicide layer, and two metallic layers. The polycrystalline silicon layer may be replaced with a polycide layer. Word lines 701 are formed from the polycrystalline silicon layer or the polycide layer and shared by gate electrodes of MIS transistors of memory cells 702. Bit lines 703 are formed from the silicide layer. One of the metallic layers provides word-backing interconnections 706 disposed on cell arrays 705 parallel to word lines 701, and some interconnections in row decoders 709, column decoders 710, array signal drive circuits 711, and peripheral circuits. The other metallic layer provides Y switches 704 disposed on cell arrays 705 and sense amplifiers 707 perpendicular to word lines 701, and some interconnections in row decoders 709, column decoders 710, array signal drive circuits 711, and peripheral circuits. Since Y switches 704 and word-backing interconnections 706 are made from different metallic layers, the interconnections parallel and perpendicular to word lines 701 have a smaller resistance than those of the first, second, and third conventional semiconductor devices, making the fourth conventional semiconductor device suitable for a large-storage-capacity configuration.

FIG. 5 shows the layout of a fifth conventional semiconductor device. The conventional semiconductor device shown in FIG. 5 has interconnections made up of four layers, i.e., a polycide layer, a silicide layer, and two metallic layers. Word lines 801 are formed from the polycide layer and shared by the gate electrodes of MIS transistors of memory cells 802. Bit lines 803 are formed from the silicide layer. One of the metallic layers provides main word lines 806 disposed on cell arrays 805 parallel to word lines 801, array signal lines 808 disposed on sense amplifiers 807 parallel to word lines 801, and some interconnections in row decoders 809, column decoders 810, array signal drive circuits 811, divided decoders 812, divided decoder drive circuits 813, and peripheral circuits. The other metallic layer provides Y switches 804 disposed on cell arrays 805 and sense amplifiers 807 perpendicularly to word lines 801, divided decoder drive signal lines 814 disposed on divided decoders 812 perpendicular to word lines 801, and some interconnections in row decoders 809, column decoders 810, array signal drive circuits 811, divided decoders 812, divided decoder drive circuits 813, and the peripheral circuits. In the fifth conventional semiconductor device, the word-backing interconnections in the fourth conventional semiconductor device are dispensed with, and some of the row decoders are scattered as divided decoders 812 between cell arrays 805, divided decoders 812 and row decoders 809 are interconnected by main word lines 806, and a signal required to select word lines 801 in divided decoders 812 is received by divided decoder drive circuits 813 and divided decoder drive signal lines 814. For further detail, reference should be made to K. Noda, T. Saeki, A. Tsujimoto, T. Murotani, and K. Koyama, "A Boosted Dual Word-line Decoding Scheme for 256 Mb DRAMs," 1992 Symposium on VLSI Circuits Digest of Technical Papers, pp. 112–113, and T. Sugibayashi, et. al., "A 30 ns 256 Mb DRAM with Multi-divided Array Structure," 1993 IEEE ISSCC Digest of Technical Papers, pp. 50–51. Since the number of main word lines 806 can be reduced to $\frac{1}{2}^n$ of the word-backing interconnections, main word lines 806 can be increased in width for reduced resistance, and the fifth conventional semiconductor device is therefore suitable for a large-storage-capacity configuration.

FIG. 6 of the accompanying drawings illustrates the circuit of a conventional sense amplifier region. In the conventional sense amplifier region, bit lines 903 and Y switches 904 lie parallel to each other, and array signal lines 908 including write data lines 921, write drive signal lines 922, read data lines 923, read drive signal lines 924, an N-channel sense amplifier drive signal line 925, and a P-channel sense amplifier drive signal line 926 lie perpendicular to bit lines 903. N-channel sense amplifier drive signal line 925 and P-channel sense amplifier drive signal line 926 are required to be in the form of metallic interconnections because they should be of a low resistance for passing currents for charging and discharging bit lines 903.

In the conventional semiconductor devices described above, since a single column decoder controls a plurality of sense amplifiers with Y switches, the number of column decoders used is lowered to reduce any increase in the area of the semiconductor device which is caused by a large-storage-capacity arrangement thereof. As the storage capacity increases from 1 Mbit to 4 Mbits to 16 Mbits to 64 Mbits, the number of sense amplifiers connected to one column decoder is increased. Therefore, it is necessary to reduce the resistance of the Y switches, and a metallic layer used for only the Y switches is needed on the cell arrays as with the fourth and fifth conventional semiconductor devices described above. The array signal lines on the sense amplifiers must also be formed from a low-resistance metallic layer as they pass a large current therethrough. Consequently, since the Y switches and the array signal lines intersect each other at the sense amplifiers, the fourth and fifth conventional large-storage-capacity semiconductor devices with shared sense amplifiers employ four-layer interconnections other than a conductive layer for forming a capacitor. The process of fabricating such a semiconductor device entails an increased number of steps, and the yield of such a semiconductor device is low.

SUMMARY OF THE INVENTION

It is an object of the present invention to provide a dynamic memory semiconductor device with shared sense amplifiers which has interconnections made from three layers other than a conductive layer for forming a capacitor, to thereby reduce the number of interconnections, minimize any increase in the chip area, and realize a DRAM of large storage capacity, thereby avoiding any increase in the number of steps of fabricating a semiconductor device with four-layer interconnections and any reduction in the yield of such a semiconductor device.

According to the present invention, there is provided a semiconductor device comprising a plurality of cell arrays each comprising a plurality of memory cells each composed of a MIS transistor and a capacitor formed by a conductive layer; a plurality of word lines and bit lines which intersect each other at the memory cells; a plurality of sense amplifiers alternating with the cell arrays; a plurality of row decoders; a plurality of column decoders, each of the column decoders being connected to and shared by a plurality of the sense amplifiers; a plurality of interconnections for transmitting selective signals from the word lines, the bit lines and the column decoders; the interconnections for transmitting selective signals from the bit lines and the column decoder extending in the direction in which the cell arrays and the sense amplifiers are arrayed; the interconnections for transmitting selective signals from the word lines, the bit lines and the column decoder being formed from three different layers, other than the conductive layer for forming a capacitor, on the cell arrays; and the interconnections for transmitting selective signals from the column decoders being formed from a metallic layer on the cell arrays.

The interconnections for transmitting selective signals from the column decoder may be formed from the metallic layer on the cell arrays and from a conductive layer, which is the same layer as for the plate electrodes of the capacitors, on the sense amplifiers.

The three different layers may include: a first layer, which layer provides gate electrodes of the MIS transistors, comprises a laminated layer of polycrystalline silicon and silicide, and has a portion providing the word lines; a second layer which comprises a silicide layer or a laminated layer of polycrystalline silicon and silicide and has a portion providing the bit lines; and a third layer which comprises a metallic layer and has a portion providing the interconnections on the cell arrays for transmitting selective signals from the column decoder.

The semiconductor device may further comprise a plurality of power supply lines and a plurality of ground lines disposed on the cell arrays and the sense amplifiers between the interconnections for transmitting selective signals from the column decoder; a plurality of P-channel MOS transistors disposed in sense amplifier regions and having respective sources, drains and gates; a plurality of N-channel MOS transistors disposed in the sense amplifier regions and having respective sources, drains, and gates; the sense amplifiers comprising flip-flop sense amplifiers composed of P-channel transistors and having common sources and flip-flop sense amplifiers composed of N-channel transistors and having common sources; wherein the power supply lines are connected to the sources of the P-channel MOS transistors, the drains of the P-channel MOS transistors are connected to the common sources of the flip-flop sense amplifiers composed of P-channel transistors, and the gates of the P-channel MOS transistors are formed from the first layer of the three layers and serve as signal lines for activating the flip-flop sense amplifiers composed of P-channel transistors; and wherein the ground lines are connected to the sources of the N-channel MOS transistors, the drains of the N-channel MOS transistors are connected to the common sources of the flip-flop sense amplifiers composed of N-channel transistors, and the gates of the N-channel MOS transistors are formed from the first layer of the three layers and serve as signal lines for activating the flip-flop sense amplifiers composed of N-channel transistors. The three different layers may include: a first layer which provides gate electrodes of the MIS transistors, comprises a laminated layer of polycrystalline silicon and silicide, and has a portion providing the word lines; a second layer which comprises a silicide layer or a laminated layer of polycrystalline silicon and silicide and has a portion providing the bit lines; and a third layer which comprises a metallic layer and has a portion providing the interconnections on the cell arrays and the sense amplifiers for transmitting selective signals from the column decoders.

The three different layers may include: a first layer which provides gate electrodes of the MIS transistors, comprises a laminated layer of polycrystalline silicon and silicide, and has a portion providing the word lines; a second layer which comprises a metallic layer and has a portion providing the bit lines; and a third layer which comprises a metallic layer and has a portion providing the interconnections on the cell arrays and the sense amplifiers for transmitting selective signals from the column decoders.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 7 is a block diagram showing the layout of a semiconductor device according to a first embodiment of the present invention;

FIG. 11 is a block diagram showing the layout of a semiconductor device according to a third embodiment of the present invention.

DETAILED DESCRIPTION OF THE PREFERRED EMBODIMENTS

Figure 1:
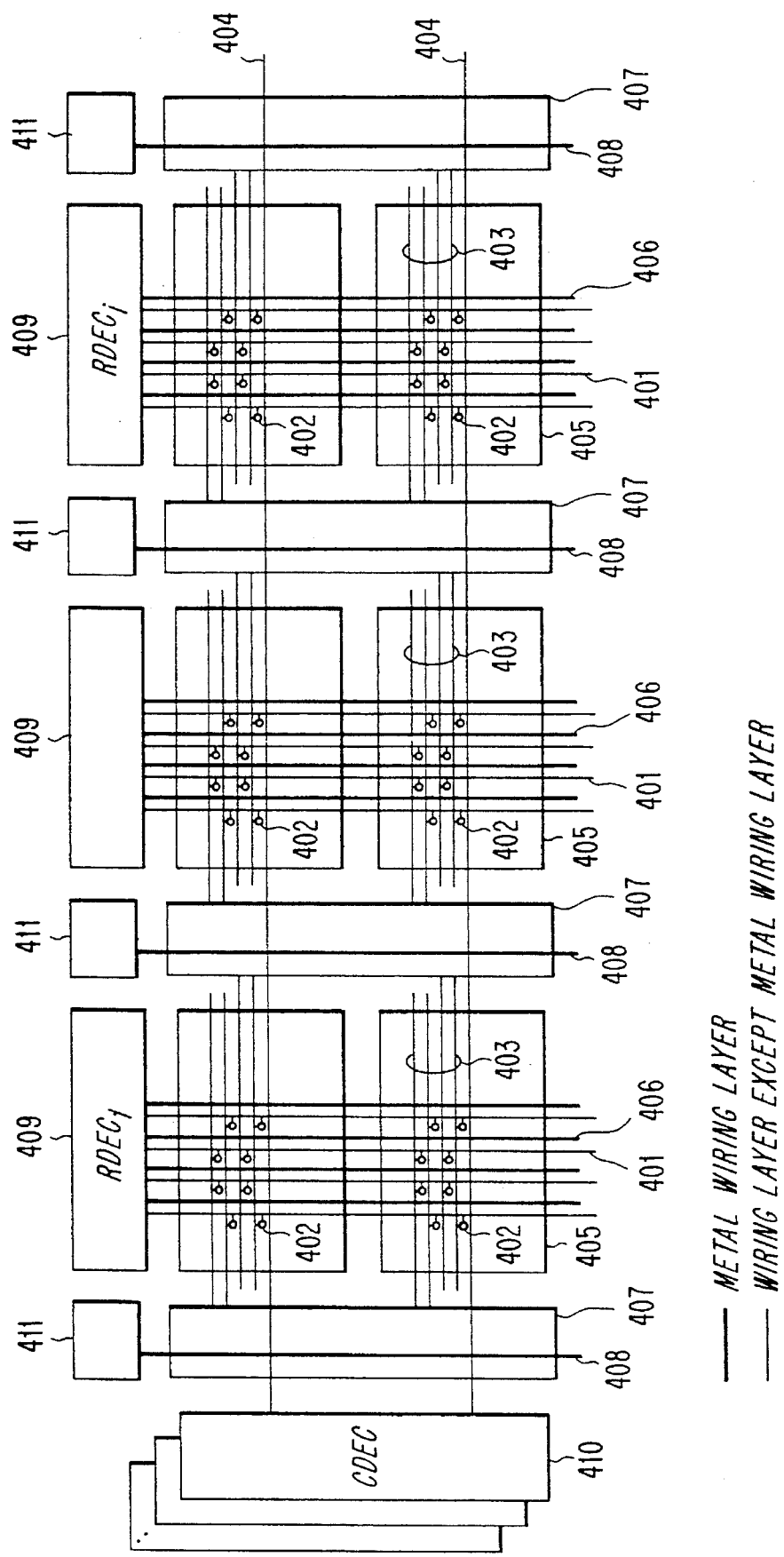
FIG. 1 is a block diagram showing the layout of a first conventional semiconductor device.
Figure 2:
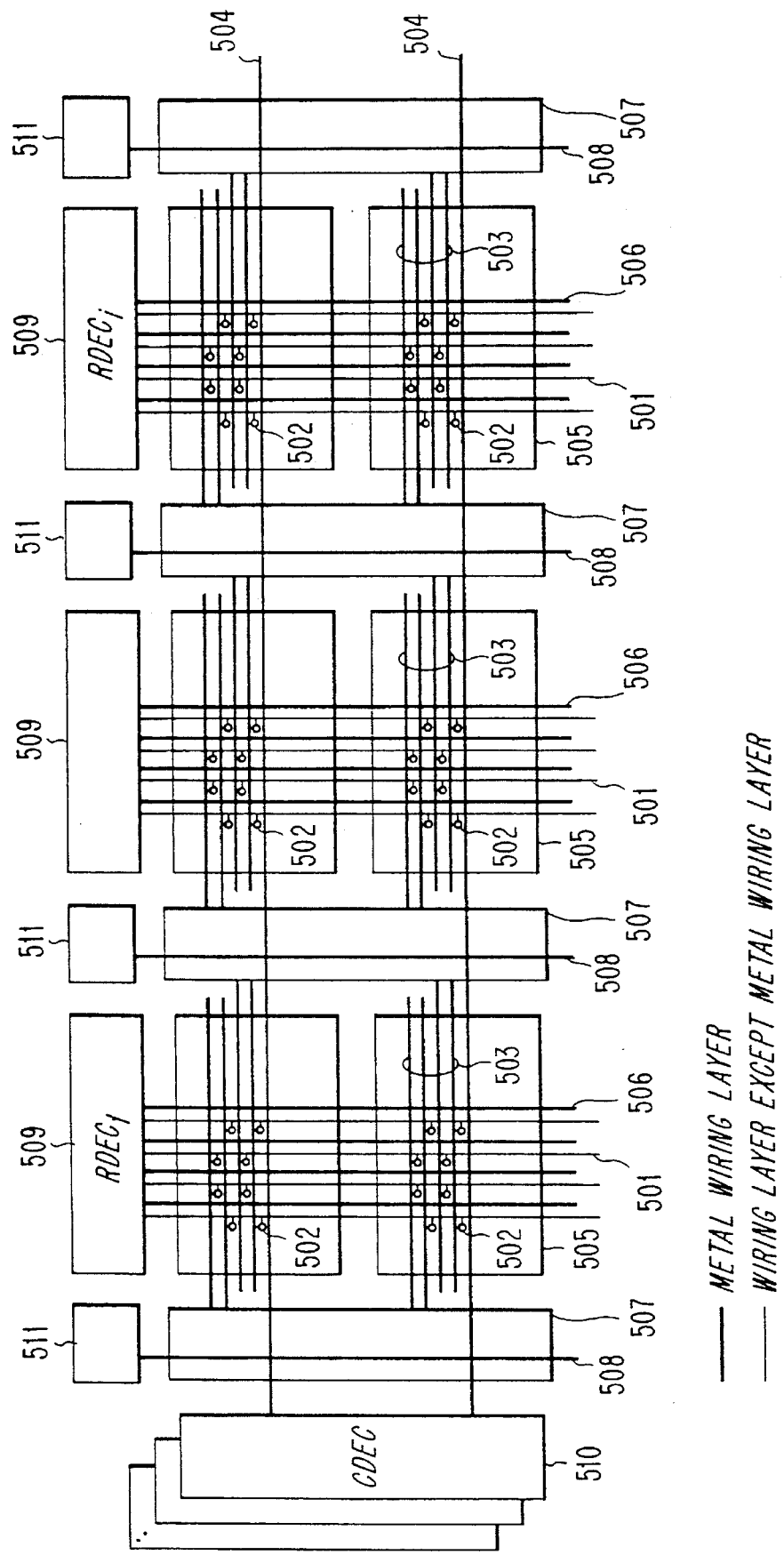
FIG. 2 is a block diagram showing the layout of a second conventional semiconductor device.
Figure 3:
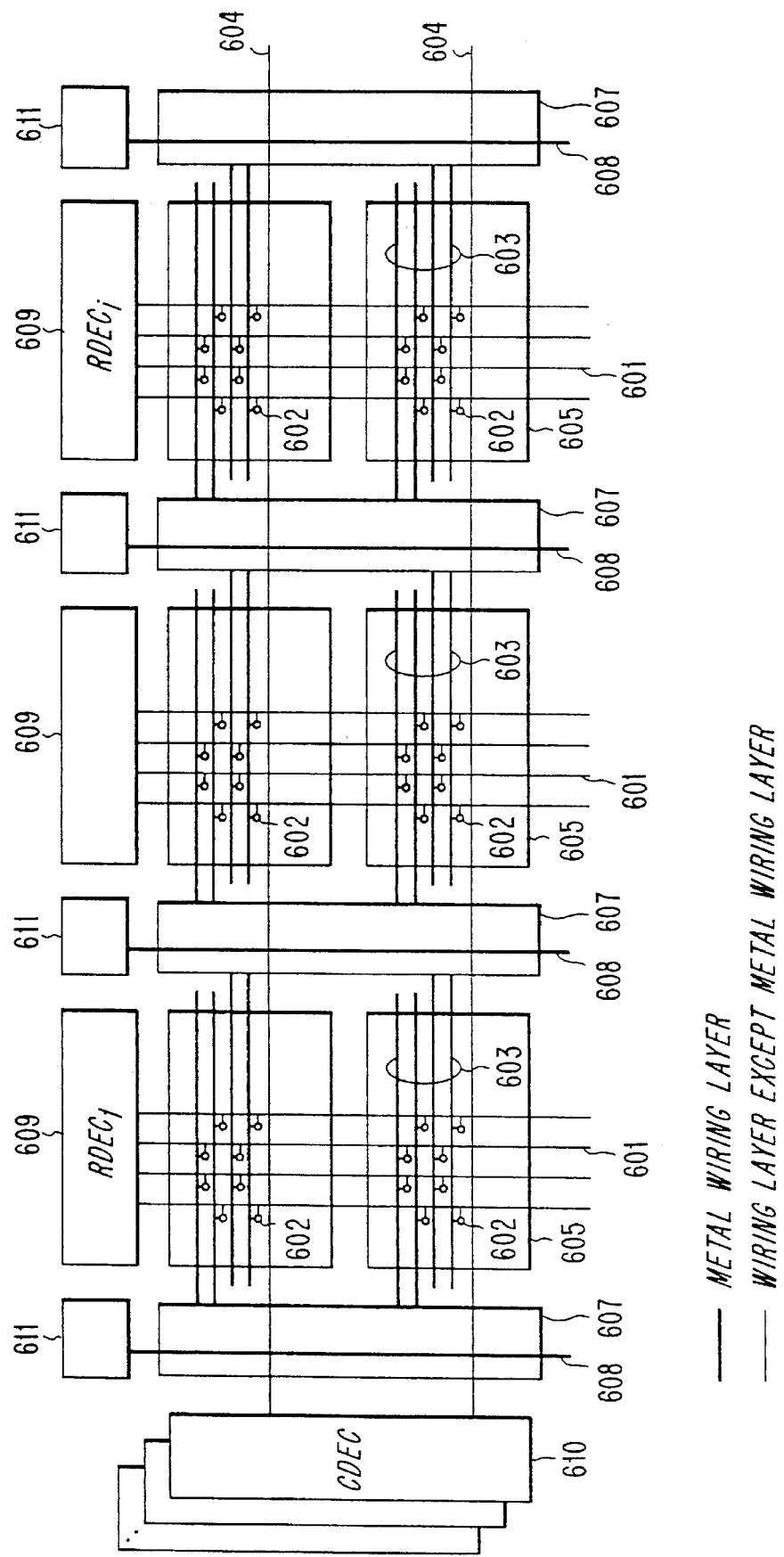
FIG. 3 is a block diagram showing the layout of a third conventional semiconductor device.
Figure 4:
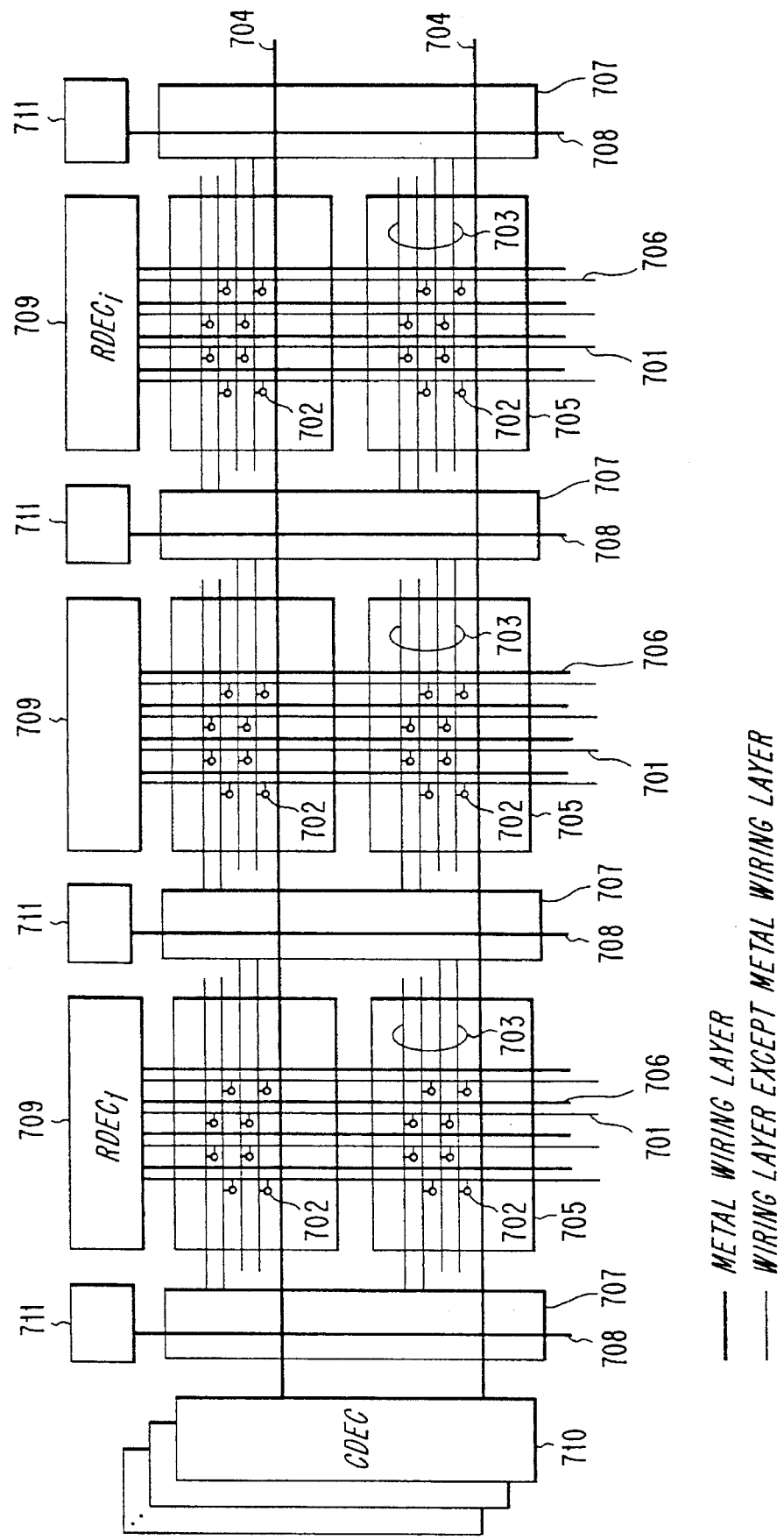
FIG. 4 is a block diagram showing the layout of a fourth conventional semiconductor device.
Figure 5:
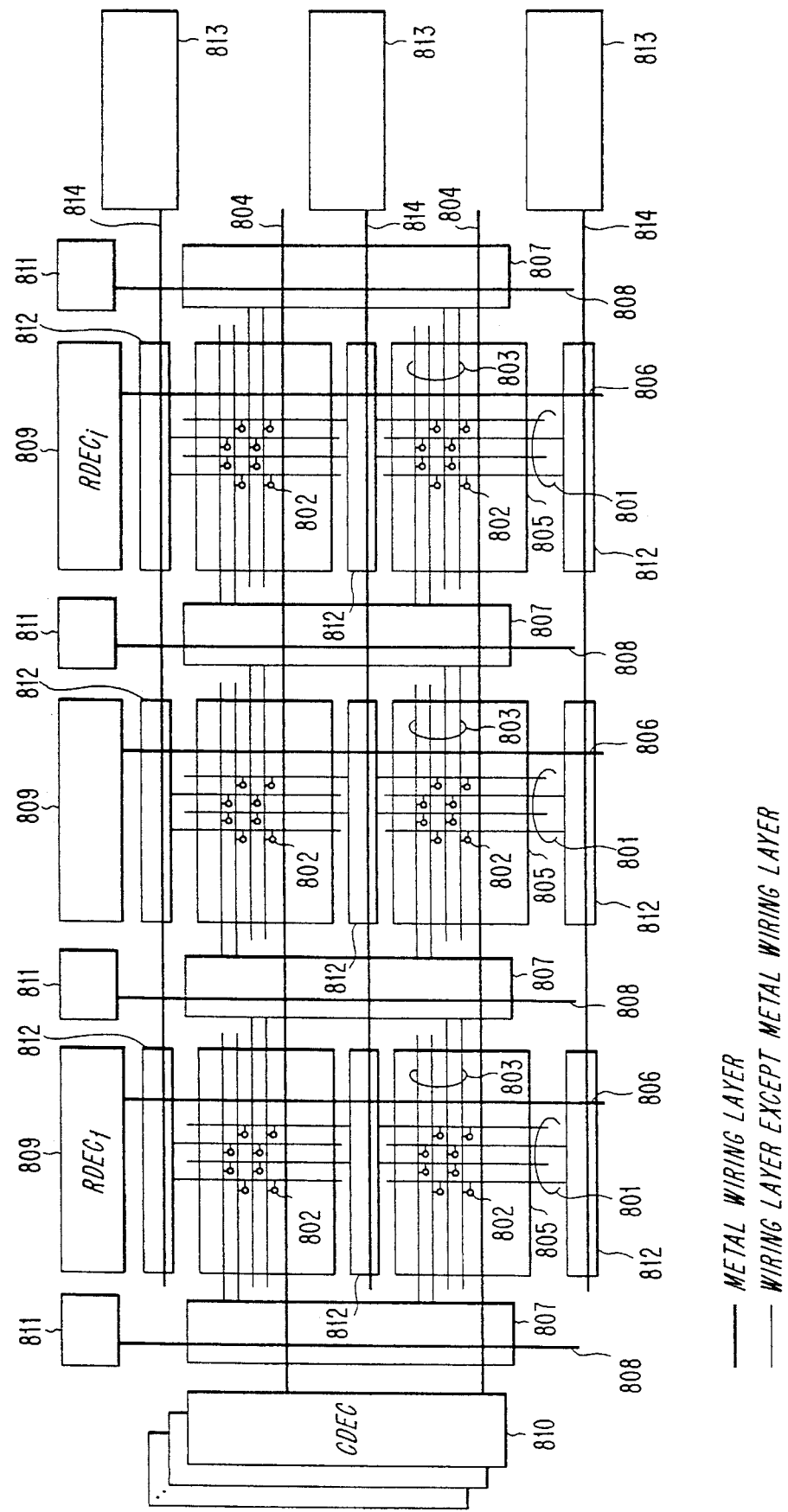
FIG. 5 is a block diagram showing the layout of a fifth conventional semiconductor device.
Figure 6:
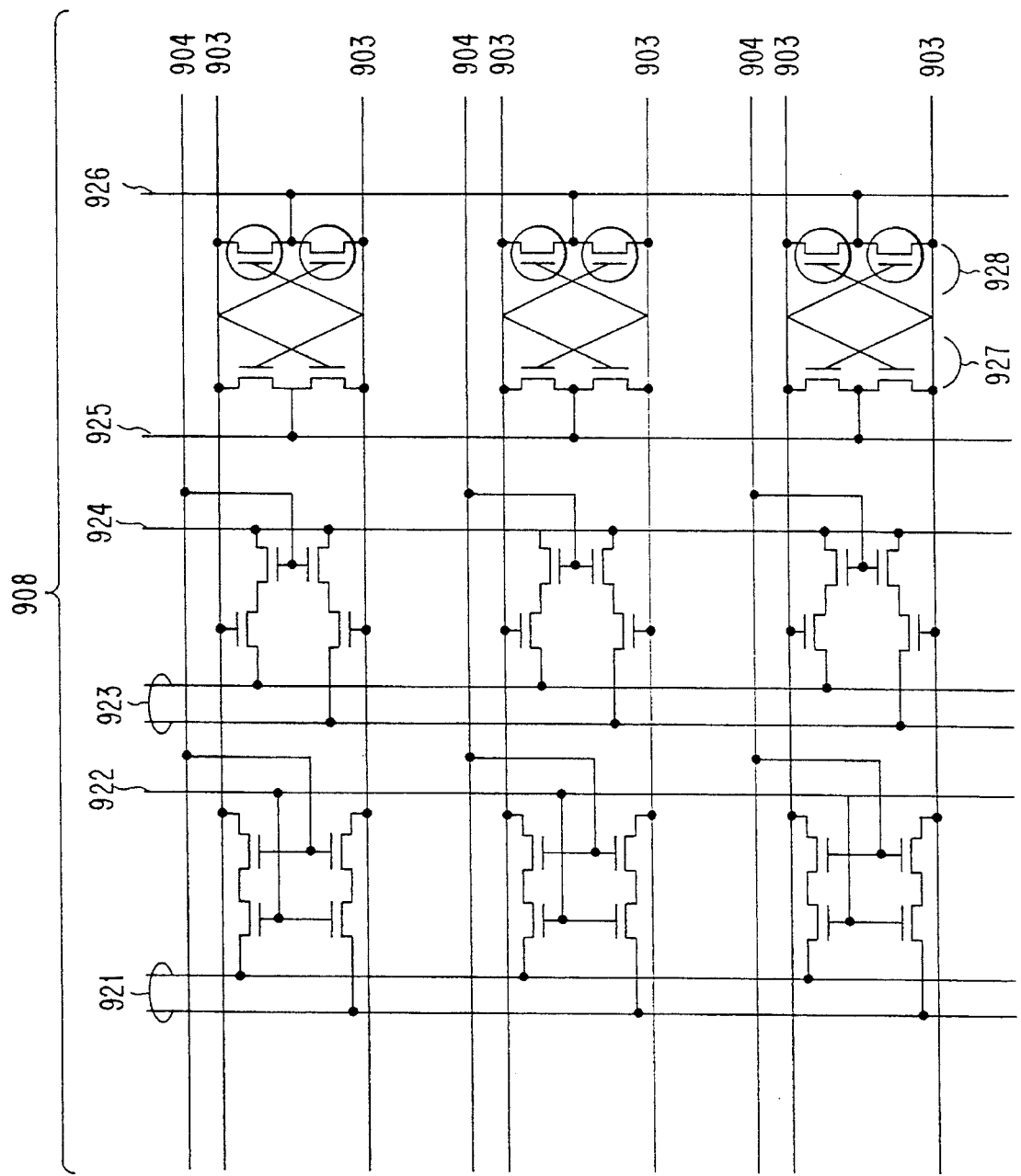
FIG. 6 is a circuit diagram of a conventional sense amplifier region.
Figure 8A:
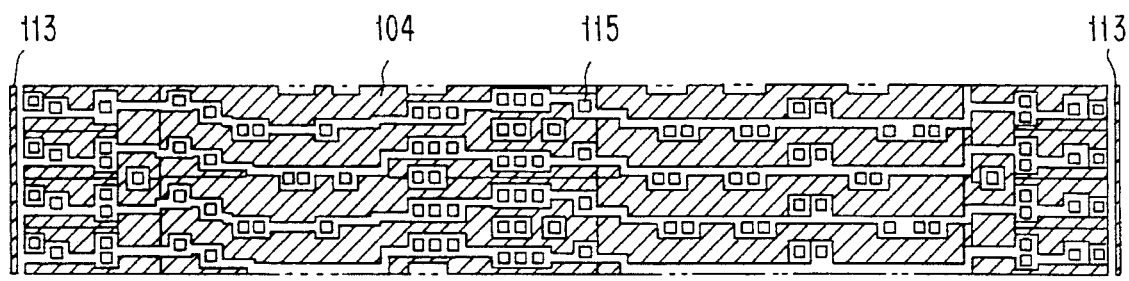
FIG. 8(a) is a cross-sectional view of a pattern of Y switches in a sense amplifier region of the semiconductor device according to the first embodiment of the present invention.
Figure 8B:
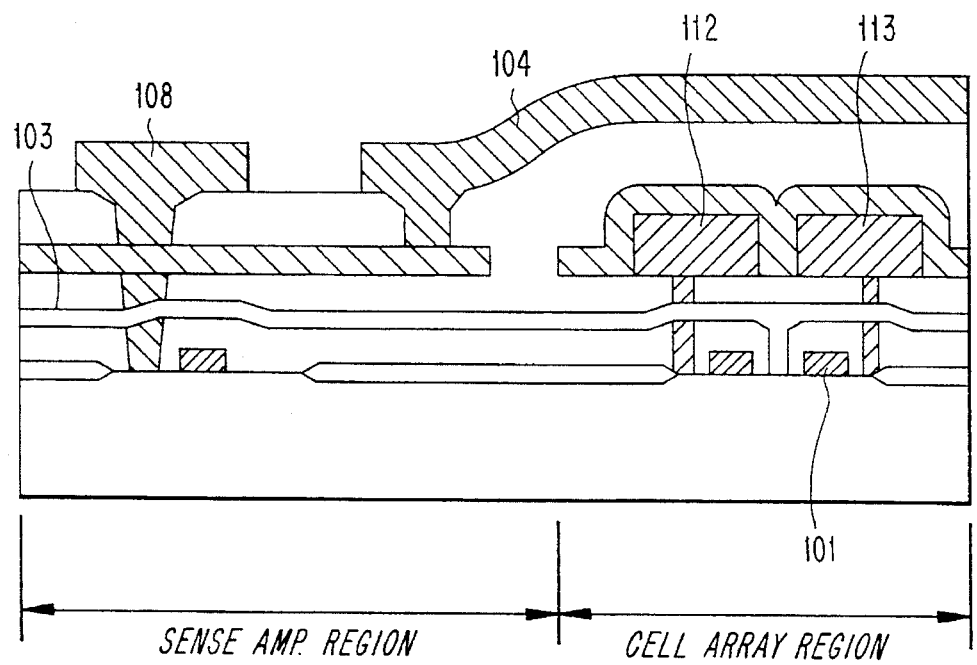
FIG. 8(b) is a cross-sectional view of a memory cell of the semiconductor device according to the first embodiment of the present invention.

A semiconductor device shown in FIGS. 7 and 8(a), 8(b) according to the first embodiment of the present invention has interconnections formed from three layers, i.e., a polycide layer, a silicide or polycide layer, and a metallic layer other than a conductive layer for forming a capacitor. The conductive layer for forming a capacitor comprises a polycrystalline silicon layer used as node electrodes 112 (see FIG. 8(b)) of the capacitors of memory cells 102 (see FIG. 7), and a polycide layer used as plate electrodes 113 (see FIGS. 8(a) and 8(b)) of the capacitors of memory cells 102.

As shown in FIG. 7, word lines 101 are formed from the polycide layer and shared by the gate electrodes of MIS transistors of memory cells 102. Bit lines 103 are formed from the silicide or polycide layer. Y switches 104 are formed from the metallic layer on cell arrays 105, and from the polycide layer on sense amplifiers 107 which is used as plate electrodes 113 of the capacitors of memory cells 102. The metallic layer provides array signal lines 108 disposed on the sense amplifiers 107 parallel to word lines 101, and interconnections in row decoders 109, a column decoder 110, array signal drive circuits 111, and peripheral circuits.

As shown in FIG. 8(b), the plate electrode 113 is positioned directly below the metallic layer. Therefore, in a sense amplifier region, the polycide layer, which is the same as the layer of plate electrode 113, is arranged as Y switch 104 in a pattern to avoid a connection hole through which the metallic layer of array signal line 108 is connected to a lower layer.

A semiconductor device according to a second embodiment of the present invention will next be described with reference to FIGS. 9 and 10.

The semiconductor device according to the second embodiment has interconnections formed from three layers, i.e., a polycide layer, a silicide or polycide layer, and a metallic layer other than a conductive layer for forming a capacitor.

Figure 9:
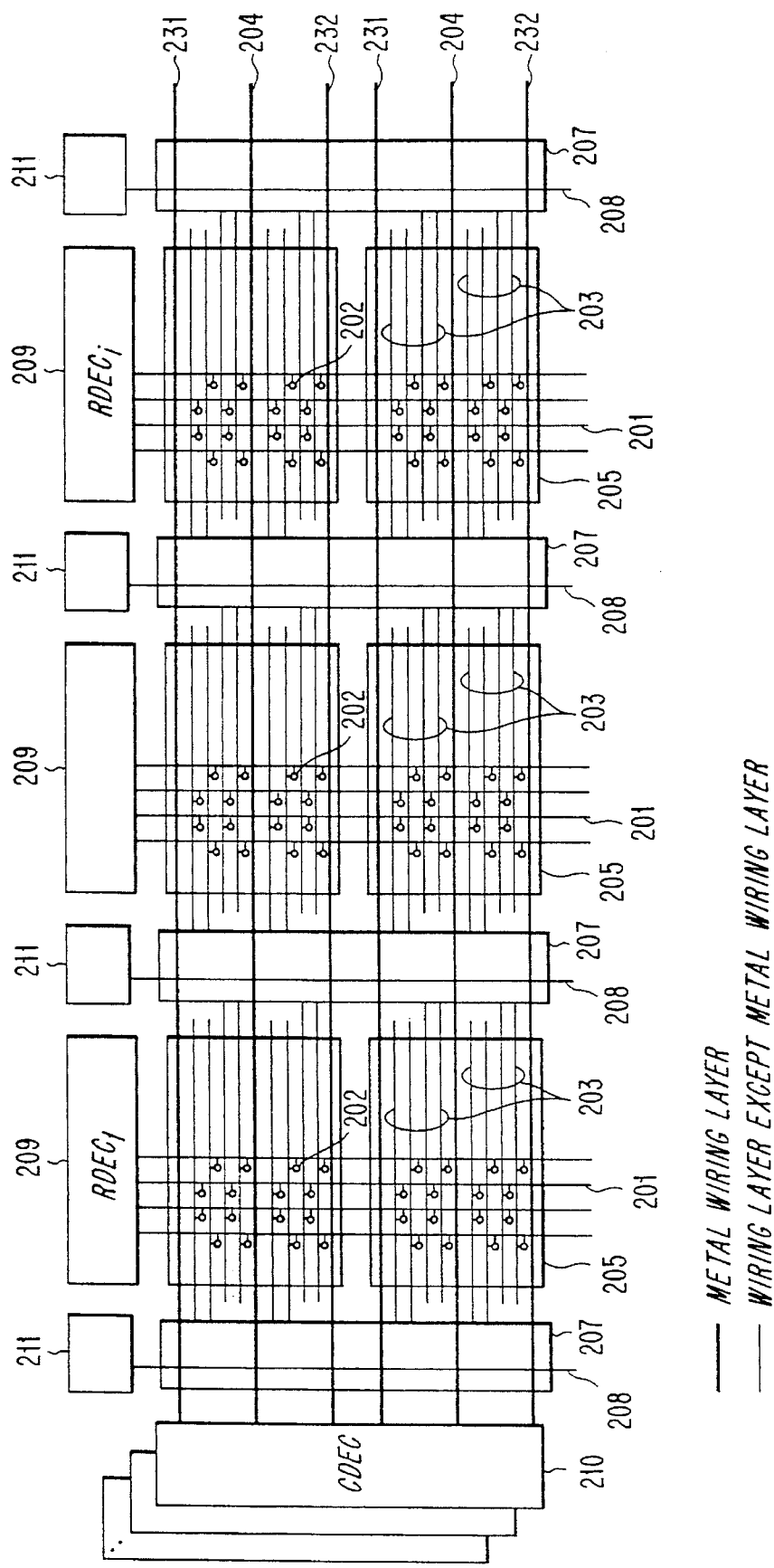
FIG. 9 is a block diagram showing the layout of a semiconductor device according to a second embodiment of the present invention.
Figure 10:
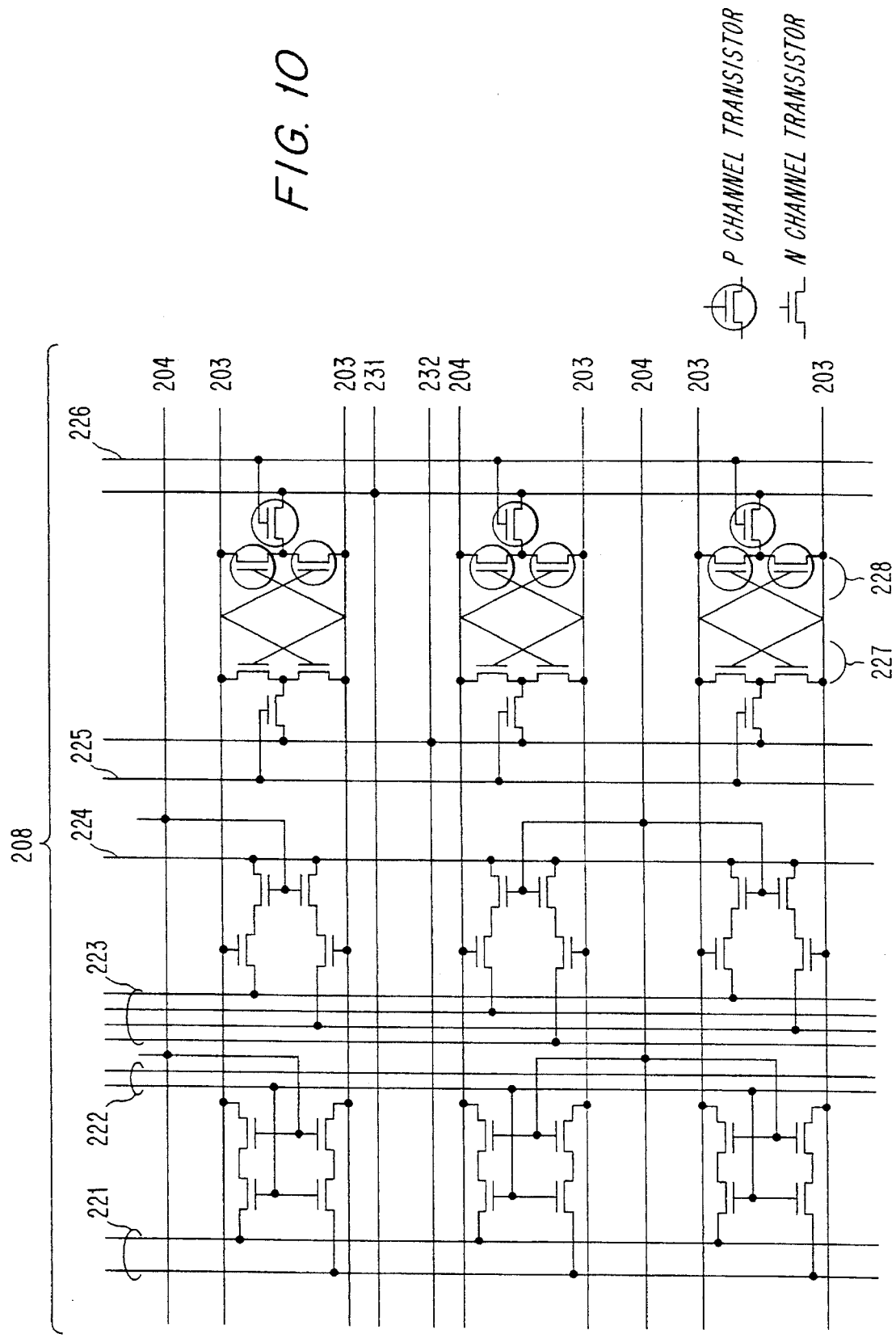
FIG. 10 is a circuit diagram of a sense amplifier region of the semiconductor device according to the second embodiment of the present invention.

As shown in FIG. 9, word lines 201 are formed from the polycide layer and are shared by the gate electrodes of MIS transistors of memory cells 202. Bit lines 203 are formed from the silicide or polycide layer. Y switches 204 are formed from the metallic layer on both cell arrays 205 and sense amplifiers 207. Array signal lines 208 disposed on sense amplifiers 207 are formed primarily from the polycide layer. The metallic layer provides interconnections in row decoders 209, a column decoder 210, array signal drive circuits 211 and peripheral circuits.

Array signal lines 208 have a large resistance and cannot pass a sufficient current therethrough as they are formed primarily from the polycide layer. As shown in FIGS. 9 and 10, power supply lines (VCC) 231 and ground lines (GND) 232 are disposed on cell arrays 205 and sense amplifiers 207 between Y switches 204. In order not to pass bit line charging and discharging currents directly to an N-channel sense amplifier drive signal line 225 and a P-channel sense amplifier drive signal line 226, power supply lines 231 are connected to the sources of P-channel MOS transistors in sense amplifier regions, the drains of the P-channel MOS transistors are connected to the common sources of flip-flop sense amplifiers composed of P-channel transistors, and the gates of P-channel MOS transistors are formed from the first polycide layer and serve as P-channel sense amplifier activating signal lines. Ground lines 232 are connected to the sources of N-channel MOS transistors in the sense amplifier regions, the drains of the N-channel MOS transistors are connected to the common sources of flip-flop sense amplifiers composed of N-channel transistors, and the gates of N-channel MOS transistors are formed from the first polycide layer and serve as N-channel sense amplifier activating signal lines.

Power supply lines 231 and ground lines 232 must be formed from the low-resistance metallic layer in order to pass a large current therethrough, and extend parallel to Y switches 204. To prevent the interconnection pitch or spacing from being reduced by the positioning of power supply lines 231 and ground lines 232 between Y switches 204, the number of Y switches 204 is reduced to half, the number of sense amplifiers connected to each Y switch 204 is increased, and the number of write drive signal lines 222 and read data lines 223 are increased accordingly.

A semiconductor device according to a third embodiment of the present invention will next be described with reference to FIG. 11.

The semiconductor device according to the third embodiment has interconnections formed from three layers, i.e., a polycide layer, a first metallic layer, and a second metallic layer.

As shown in FIG. 11, word lines 301 are formed from the polycide layer and are shared by the gate electrodes of MIS transistors of memory cells 302. Bit lines 303 are formed from the first metallic layer on cell arrays 305 and primarily from the polycide layer on sense amplifiers 307. Y switches 304 are formed from the second metallic layer on both cell arrays 305 and sense amplifiers 307. The first and second metallic layers provide interconnections in row decoders 309, a column decoder 310, array signal drive circuits 311, and peripheral circuits. Array signal lines 308 are formed from the first metallic layer.

Although certain preferred embodiments of the present invention have been shown and described in detail, it should be understood that various changes and modifications may be made therein without departing from the scope of the appended claims.

What is claimed is:

1. A semiconductor device comprising:
    a plurality of cell arrays each comprising a plurality of memory cells each composed of a Metal Insulator Semiconductor transistor and a capacitor formed by a conductive layer;
    a plurality of word lines and bit lines which intersect each other at said memory cells;
    a plurality of sense amplifiers alternating with said cell arrays;
    a plurality of column decoders, each of said column decoders being connected to and shared by a plurality of said sense amplifiers; and
    a plurality of interconnections for transmitting selective signals from said word lines, said bit lines, and said column decoders, said interconnections for transmitting selective signals from said bit lines and said column decoders extending in a direction in which said cell arrays and said sense amplifiers are arrayed, said interconnections for transmitting selective signals from said word lines, said bit lines, and said column decoders being formed from four different layers, including said conductive layer for forming said capacitor, on the semiconductor device;
    wherein, said interconnections for transmitting selective signals from said column decoders are formed from a metallic layer on the cell arrays and are formed from a conductive layer, which is the same layer that forms plate electrodes of the capacitors, on the sense amplifiers.

2. A semiconductor device according to claim 1, wherein said four different layers include a first layer which provides gate electrodes of the MIS transistors, comprises a laminated layer of polycrystalline silicon and silicide, and has a portion providing said word lines; a second layer which comprises a silicide layer and has a portion providing said bit lines; a third layer which comprises a metallic layer and has a portion providing the interconnections on the cell arrays for transmitting selective signals from said column decoders; and a fourth layer which comprises a conductive layer, which is the same layer that forms plate electrodes of the capacitors, on the sense amplifiers and has a portion providing the interconnections on the cell arrays for transmitting selective signals from said column decoders.

3. A semiconductor device according to claim 1, wherein said four different layers include a first layer which provides gate electrodes of the MIS transistors, which comprises a laminated layer of polycrystalline silicon and silicide, and has a portion providing said word lines; a second layer which comprises a laminated layer of polycrystalline silicon and silicide and has a portion providing said bit lines; and a third layer which comprises a metallic layer and has a portion providing the interconnections on the cell arrays for transmitting selective signals from said column decoders; and a fourth layer which comprises a conductive layer, which is the same layer that forms plate electrodes of the capacitors, on the sense amplifiers and has a portion providing the interconnections on the cell arrays for transmitting selective signals from said column decoders.

\* \* \* \* \*